(12) United States Patent
Durai

(10) Patent No.: US 10,585,835 B1
(45) Date of Patent: Mar. 10, 2020

(54) METHODS AND APPARATUSES FOR INDEPENDENT TUNING OF ON-DIE TERMINATION IMPEDANCES AND OUTPUT DRIVER IMPEDANCES, AND RELATED SEMICONDUCTOR DEVICES AND SYSTEMS

(71) Applicant: Micron Technology, Inc., Boise, ID (US)

(72) Inventor: Elancheren Durai, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/196,545

(22) Filed: Nov. 20, 2018

(51) Int. Cl.
| | | |
|---|---|---|
| *G11C 11/40* | (2006.01) | |
| *G06F 13/40* | (2006.01) | |
| *G11C 7/10* | (2006.01) | |
| *G11C 7/22* | (2006.01) | |

(52) U.S. Cl.
CPC ........ *G06F 13/4086* (2013.01); *G11C 7/1063* (2013.01); *G11C 7/1066* (2013.01); *G11C 7/22* (2013.01); *G11C 11/40* (2013.01)

(58) Field of Classification Search
CPC ...... G11C 7/1051; G11C 7/1084; G11C 7/109
See application file for complete search history.

(56) References Cited

U.S. PATENT DOCUMENTS

| | | | | |
|---|---|---|---|---|
| 5,668,774 A | * | 9/1997 | Furutani | G11C 7/1033 365/193 |
| 6,161,204 A | * | 12/2000 | Gans | G11C 29/028 714/718 |
| 9,324,410 B2 | | 4/2016 | Arai | |
| 2003/0133330 A1 | * | 7/2003 | Pekny | G11C 8/08 365/185.23 |
| 2011/0205832 A1 | * | 8/2011 | Jeon | G11C 7/1057 365/233.16 |

* cited by examiner

*Primary Examiner* — Tuan T Nguyen
(74) *Attorney, Agent, or Firm* — TraskBritt

(57) ABSTRACT

An apparatus may include a control device configured to determine an operational mode of the apparatus. The apparatus may also include at least one output circuit coupled to the control device. The at least one output circuit may be configured to generate a desired output driver impedance (ODI) during an active operational mode. The least one output circuit may further be configured to independently generate a desired on-die termination (ODT) impedance during an inactive operational mode. Memory systems, memory devices, electronic systems, and related methods of operation are also described.

20 Claims, 12 Drawing Sheets

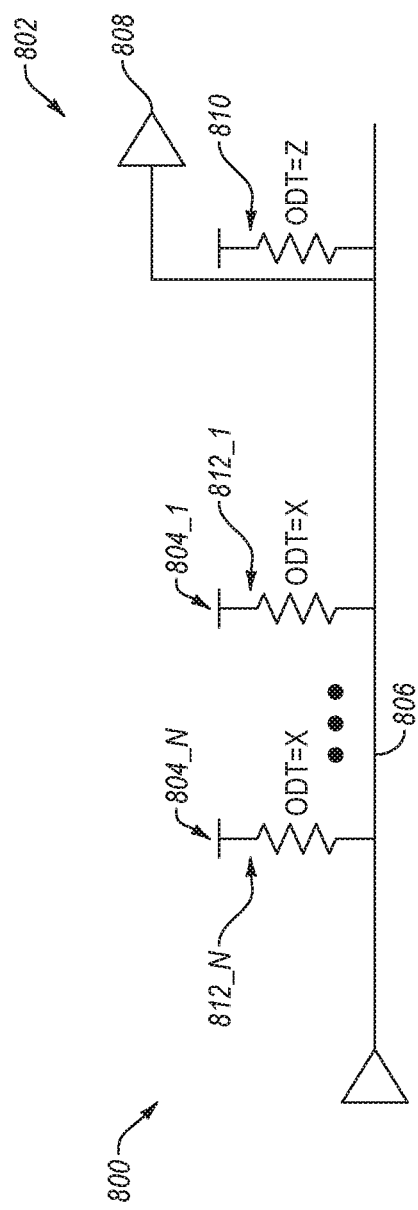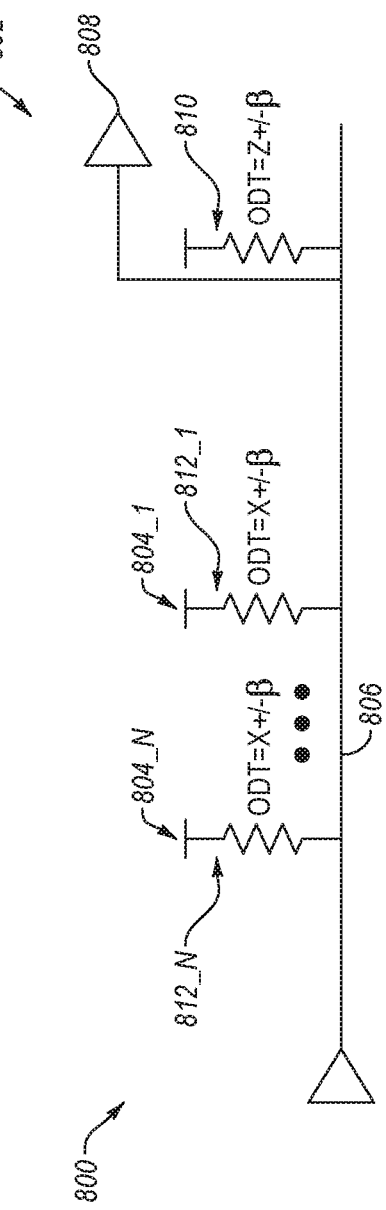

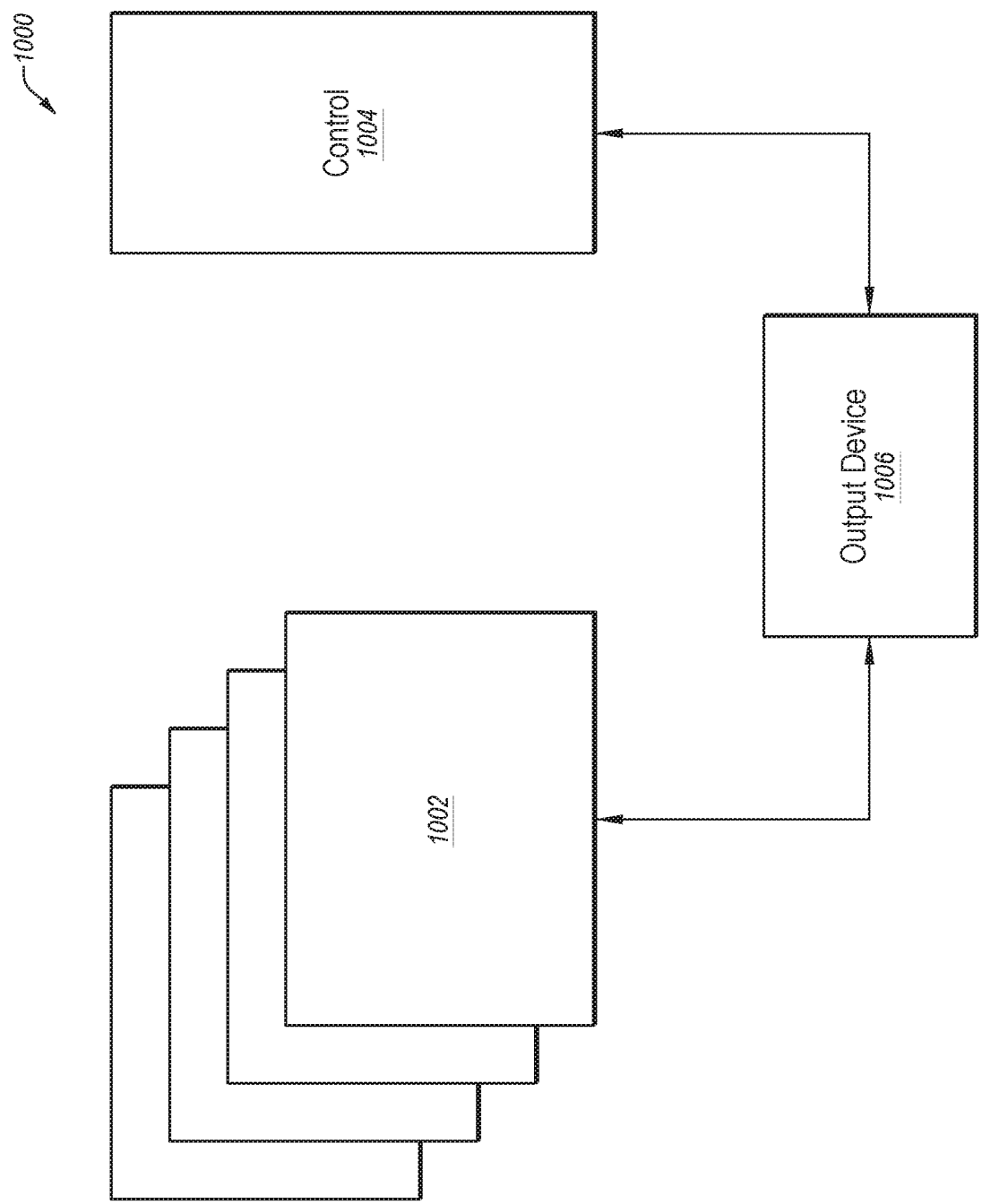

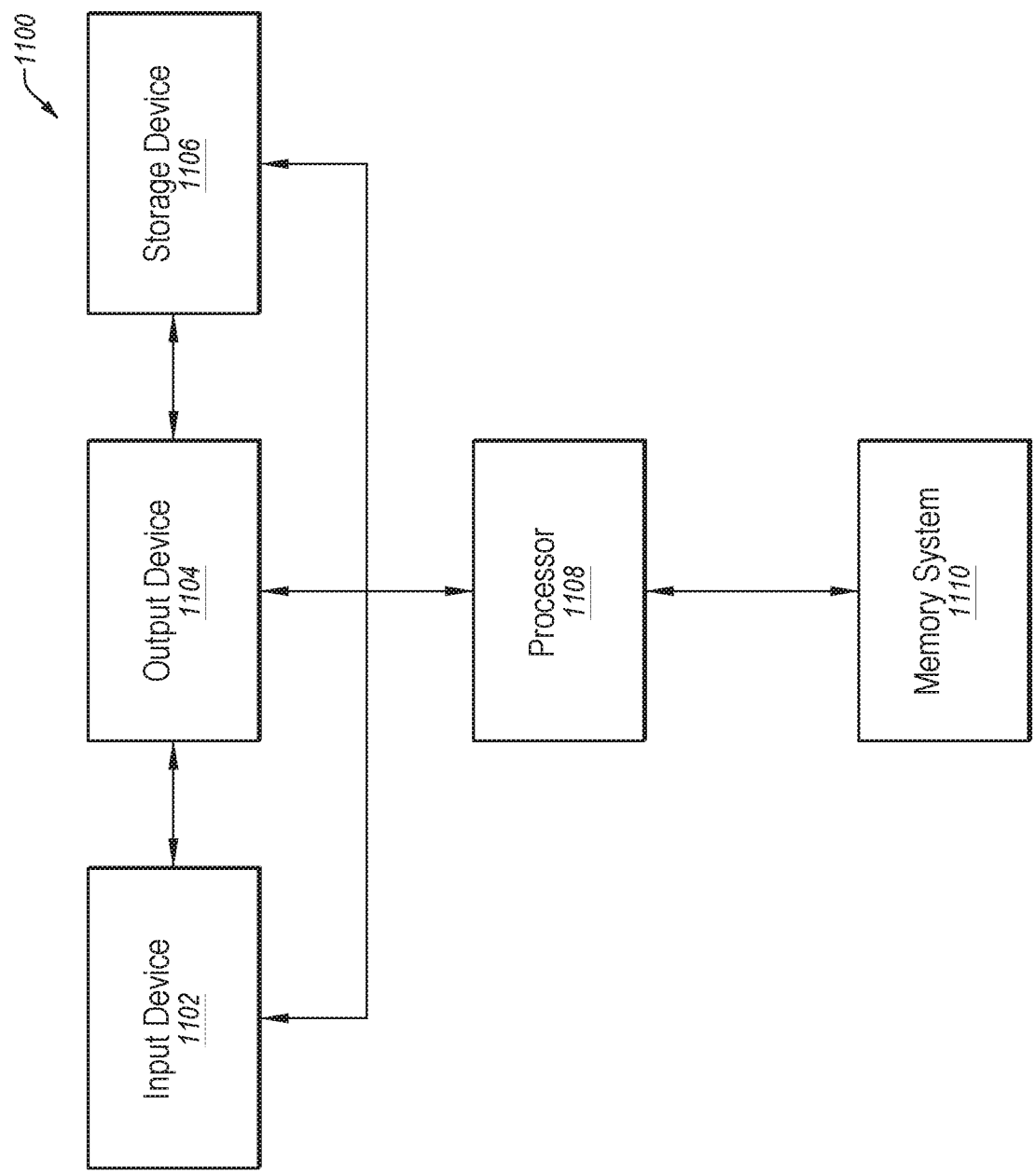

METHODS AND APPARATUSES FOR INDEPENDENT TUNING OF ON-DIE TERMINATION IMPEDANCES AND OUTPUT DRIVER IMPEDANCES, AND RELATED SEMICONDUCTOR DEVICES AND SYSTEMS

TECHNICAL FIELD

Embodiments of the disclosure relate to tuning impedance values of a memory device, and more specifically, to independently tuning on-die termination impedance and output driver impedance values of memory devices of a memory system based on operational modes of the memory devices. Yet more specifically, some embodiments relate to methods and apparatuses for such tuning, and related memory devices, semiconductor devices, and systems.

BACKGROUND

Memory devices are typically provided as internal, semiconductor, integrated circuits in computers or other electronic systems. There are many different types of memory including, for example, random-access memory (RAM), read only memory (ROM), dynamic random access memory (DRAM), synchronous dynamic random access memory (SDRAM), resistive random access memory (RRAM), double data rate memory (DDR), low power double data rate memory (LPDDR), phase change memory (PCM), and Flash memory.

Electronic systems, such as memory systems, often include one or more types of memory, and that memory is typically coupled to one or more communications channels within a memory system. Time varying signals in such systems are utilized to transfer information (e.g., data) over one or more conductors often referred to as signal lines. These signal lines are often bundled together to form a communications bus, such as an address or data bus.

To meet demands for higher performance operating characteristics, designers continue to strive for increasing operating speeds to transfer data across communications buses within electronic systems. One issue with increased data transfer rates is maintaining signal integrity during bursts of data on communication buses of electronic (e.g., memory) systems. As transfer rates increase, impedance characteristics of a communication bus may become more pronounced, and signal waveforms may begin to spread out and/or reflections may occur at locations of unmatched impedance on the communication bus. Signal integrity (e.g., data integrity) may be affected when an impedance (e.g., output impedance) of one or more nodes of a memory device coupled to a communication bus is not properly matched to an impedance of the communications bus. It may be desirable to reduce impedance mismatch in an electronic system (e.g., to reduce a likelihood of data corruption as data is transmitted on a communication bus).

BRIEF DESCRIPTION OF THE DRAWINGS

FIG. 8A depicts a portion of a memory system in a default configuration, according to various embodiments of the disclosure.

FIG. 8B depicts a portion of the memory system of FIG. 8A during a write operation, in accordance with various embodiments of the disclosure.

FIG. 10 is a simplified block diagram of a semiconductor device implemented according to one or more embodiments described herein.

FIG. 11 is a simplified block diagram of an electronic system implemented according to one or more embodiments described herein.

DETAILED DESCRIPTION

A memory device (e.g., of a memory system) may include an output device including one or more output drivers for driving signals (e.g., off-chip) during data transmission. A memory device may further include one or more on-die termination circuits for terminating a transmission line (e.g., an off-chip transmission line) during data reception. Both an output driver impedance and an on-die termination impedance of a memory device may be critical to maintain suitable signal integrity during data communication (e.g., chip-to-chip communication).

Various embodiments of the disclosure relate to tuning impedance values of a memory device, and more specifically, to independently tuning on-die termination (ODT) impedances and output driver impedances (ODIs) of memory devices of a memory system based on operational modes of the memory devices. For example, in some embodiments, an ODI of an active memory device of a memory system may be tuned (e.g., based on a first parameter) (e.g., during a read operation), and an ODT impedance of one or more inactive memory devices of the memory system may be independently tuned (e.g., based on a second, different parameter) (e.g., during the read operation).

As described more fully herein, in contract to conventional systems, independently tuning ODT impedances and ODIs of memory devices of a memory system may allow for independent data eye tuning. Independent data eye tuning may enhance data eyes for memory read and/or write operations. Independent data eye tuning may also improve memory input/output performance, and may enable for independent tuning of transmission line parameters, which may improve rank margin testing (RMT) results of data eyes and associated semiconductor devices. Further, various embodiments may reduce or eliminate a need for reticle changes to semiconductor materials (e.g., silicon) or other high cost re-designs (e.g., to correct one or more product issues). Moreover, various embodiments may provide flexibility for customizing input/output parameters of integrated circuits.

Figure 1:
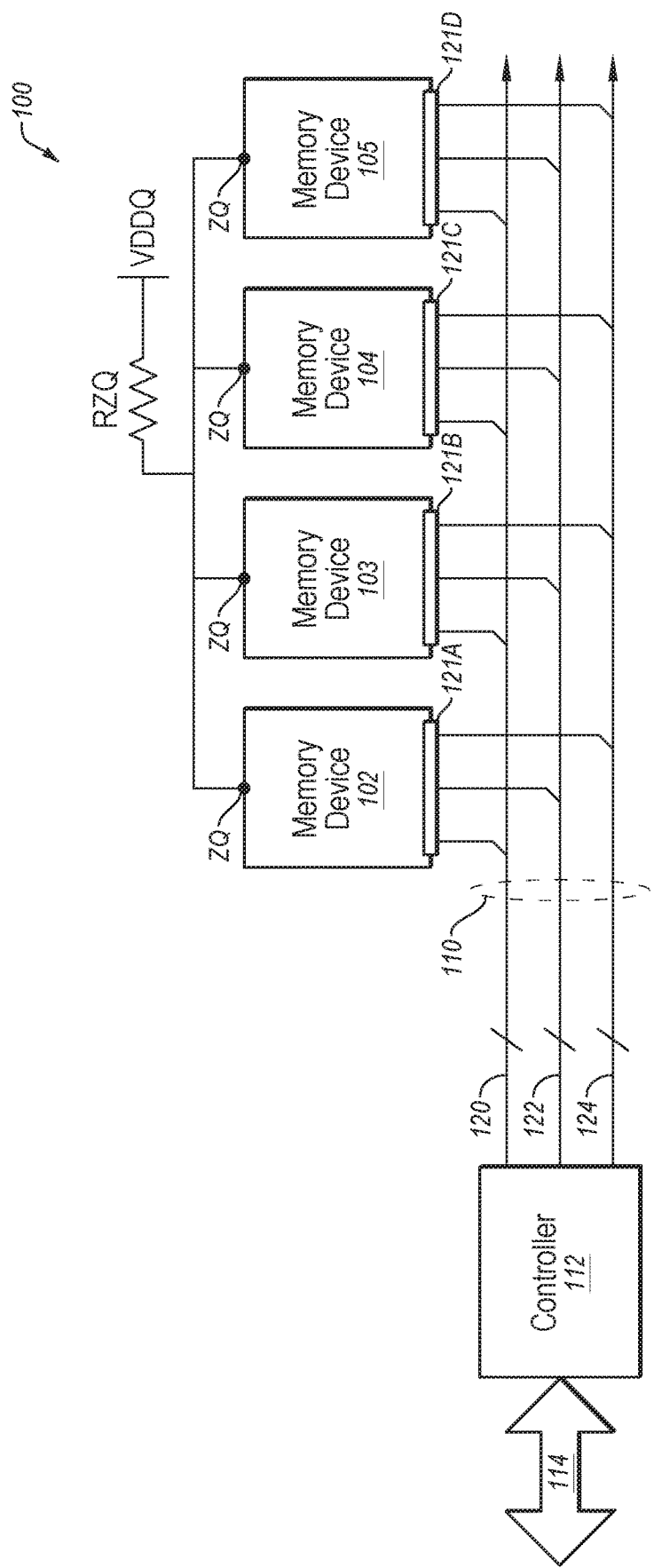
FIG. 1 is a block diagram of a memory system including a number of memory devices, in accordance with various embodiments of the present disclosure.

FIG. 1 illustrates a memory system 100, according to various embodiments of the present disclosure. Memory system 100 includes a number of memory devices 102-105 coupled to a communications bus 110 (e.g., a system bus). Each memory device 102-105 may include one or more memory die, and collectively, memory devices 102-105 may be referred to as a dual in-line memory module (DIMM), a multi-chip package (MCP) or a package on package (POP).

Memory system 100 further includes a controller 112 coupled to each memory device 102-105 via communication bus 110. Controller 112, which may include a processor or any other type of controller, may be configured to control and/or regulate various operations of memory system 100, as well as provide interactivity with another device or system coupled to memory system 100 via an interface 114.

Communication bus 110 may include one or more of an address bus 120, a data bus 122, and a control signal bus 124. In some embodiments, memory devices 102-105, communication bus 110, and controller 112 may be configured (e.g., physically arranged and mounted) on a printed circuit board (PCB).

According to some embodiments of the present disclosure, at least some of memory devices 102-105 may be coupled to communication bus 110 via an associated interface 121A-121D. For example, interface 121 may include one or more nodes (e.g., input/output (I/O) nodes) for coupling signal lines of an associated memory device to respective signal lines of communication bus 110. Further, interface 121 may include one or more nodes coupled to one or more power supplies (not shown in FIG. 1), such as, for example, power and/or reference potentials. For example, each interface 121 may include an electromechanical type connection or soldered lead connections to communication bus 110.

Each memory device 102-105 of memory system 100 may include a calibration terminal ZQ, which may be coupled to a power supply potential VDDQ via a reference resistor RZQ. For example, reference resistor RZQ, which may be provided on a memory module substrate or a motherboard, may include a resistor that may be referenced during a calibration operation, as described more fully below.

To improve signal integrity of system 100, such as in high data rate applications, one or more of memory devices 102-105 may utilize ODIs and/or ODT impedances. More specifically, during an operation (e.g., a read operation), an active memory device (e.g., memory device 102) of a memory system (e.g., memory system 100) may utilize an ODI, and one or more inactive memory devices (e.g., memory devices 103-105) of the memory system may utilize an ODT impedance.

A memory device (e.g., memory device 102) may be in an active mode in response to the memory device being selected to drive data bus 122 to a particular state, such as in response to performing a read operation in the memory device. Further, the memory device (e.g., memory device 102) may be in an inactive mode when another memory device (e.g., memory device 104) is selected to drive data bus 122 to a particular state, such as in response to performing a read operation in the other memory device (e.g., memory device 104).

For example, an ODT impedance of an inactive memory device (i.e., a memory device operating in an inactive mode) may be tuned such that the inactive memory device may function as a terminator. More specifically, for example, one or more output nodes of the inactive memory device be configured to act as terminators for the bus to which it is coupled. For example, one or more pull-up and/or pull-down resistors of an output device of the inactive memory device may be selectively configured to tune the ODT impedance of the inactive memory device.

Further, for example, an ODI of an active memory device (i.e., a memory device operating in an active mode) may be tuned such that an ODI of an output device of the active memory device may match an input impedance of a transmission media, such as an electrical cable or another circuit or card, coupled to the output device. Matching the ODI impedance of the output device to the input impedance of a transmission media may maximize the transfer of power in a signal. For example, one or more pull-up and/or pull-down resistors of the output device of the active memory device may be configured to tune the ODI of the active memory device.

Figure 2:
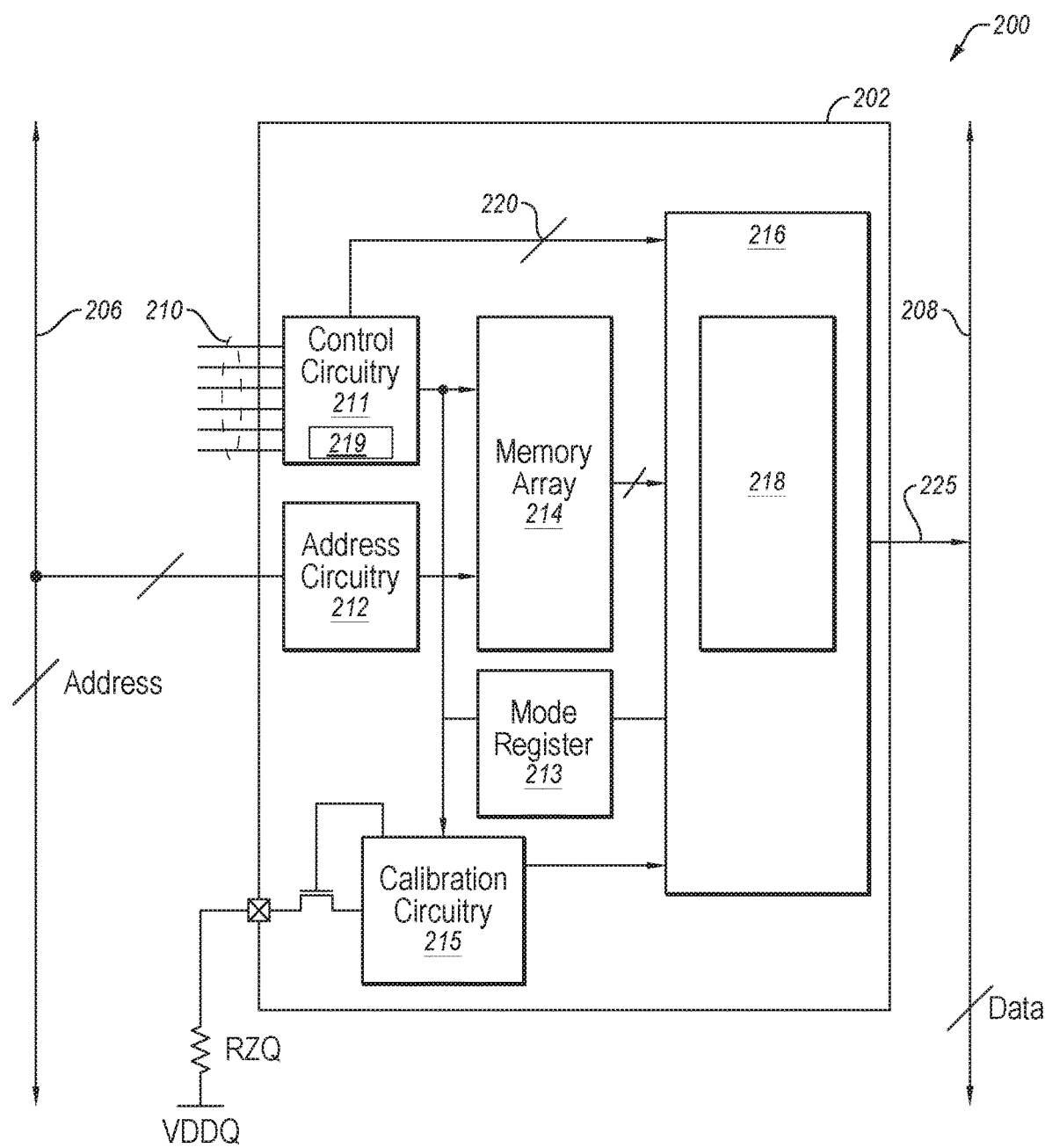
FIG. 2 is a functional block diagram of a memory device, according to various embodiments of the present disclosure.

FIG. 2 illustrates a memory device 202, according to various embodiments of the present disclosure. Memory device 202, which may include, for example, a DRAM (dynamic random access memory), a SRAM (static random access memory), a SDRAM (synchronous dynamic random access memory), a DDR SDRAM (double data rate DRAM), or a SGRAM (synchronous graphics random access memory), may be part of a memory system 200. For example, memory device 202 may include one of memory devices 102-105 of FIG. 1.

Memory device 202 may be coupled to an address bus 206, a data bus 208, and a control signal bus 210. Address bus 206, data bus 208, and control signal bus 210 may be combined, at least in part, to define a communication bus, such as communication bus 110 of FIG. 1. In some embodiments, control signal bus 210 may include both memory device specific control signal lines and control signal lines commonly coupled to multiple memory devices (e.g., of memory system 200).

Memory device 202 further includes control circuitry 211, address circuitry 212, a mode register 213, a memory array 214, calibration circuitry 215, and an output device 216, which may include one or more output driver circuits (also referred to herein as "output circuitry") 218. In some embodiments, mode register 213 may include one or more parameters indicative of an operational mode of semiconductor device 202.

Address circuitry 212 is coupled to address bus 206 and may be configured to receive address information from an external controller (e.g., controller 112 of FIG. 1) to access memory array 214 of memory device 202. Output device 216 may be coupled to data bus 208 via one or more output nodes 225.

Control circuitry 211, which is coupled to control signal bus 210, may be configured to control and/or manage operations within memory device 202, such as, for example, verify, read, write, and erase operations to be performed on memory array 214. Further, in some embodiments, control circuitry 211, in response to receipt of one or more signals from a controller (e.g., controller 112 of FIG. 1), may determine whether memory device 202 is in an active (driving) mode, an inactive (terminating) mode, or another mode. More specifically, for example, control circuitry 211 may receive and decode (e.g., via a command decoder 219 of control circuitry) one or more signals from the controller to determine an operational mode of memory device 202. In some embodiments, an operational mode of memory device 202 may be determined via a state machine of command decoder 219.

Alternatively or additionally, one or more settings and/or data (e.g., one or more settings and/or data of mode register 213) of memory device 202 may be used to determine an operational mode of memory device 202. For example, memory device 202 may be configured to determine (e.g., via logic) if memory device 202 is applying one or more ODT and/or ODI values. More specifically, for example, memory system 200 may determine if memory device 202 is applying one or more ODT settings (e.g., mode register settings, such as nominal termination (Rtt_Nom), park termination (Rtt_Park), and/or dynamic termination (Rtt_Wr)) or one or more ODI settings. Based on determining whether memory device 202 is applying one or more ODT or ODI settings, memory system 200 may determine whether the memory device is in an default mode, an active mode, or an inactive mode.

Control circuitry 211 may also be configured to control various operations within output device 216 by communicating various control signals over one or more signal lines 220. For example, in response to determining an operational mode of memory device 202, control circuitry 211 may convey one or signals to output device 216 for configuring one or more output driver circuits 218 in an active mode (also referred to herein as a "drive mode") or an inactive mode (also referred to herein as an "termination mode").

For example, in response to determining memory device 202 is operating in an active mode, one or more pull-up and/or pull-down resistances (not shown in FIG. 2) of one or more output driver circuits 218 may be coupled to one or more output nodes 225 of memory device 202 to tune an ODI of memory device 202. Further, for example, in response to determining memory device 202 is operating in an inactive mode, one or more pull-up and/or pull-down resistances (not shown in FIG. 2) of one or more output driver circuits 218 may be coupled to one or more output nodes 225 of memory device 202 to tune an ODT impedance of memory device 202.

In some embodiments, for both active and inactive modes, resistances may be switched in and out of output device 216 responsive to one or more control signals provided by, for example, control circuitry 211. Further, in at least some embodiments, one or more output driver circuits 218 may be tuned based on stored ("trim") values (e.g., values previously determined via a calibration process).

Figure 3A:
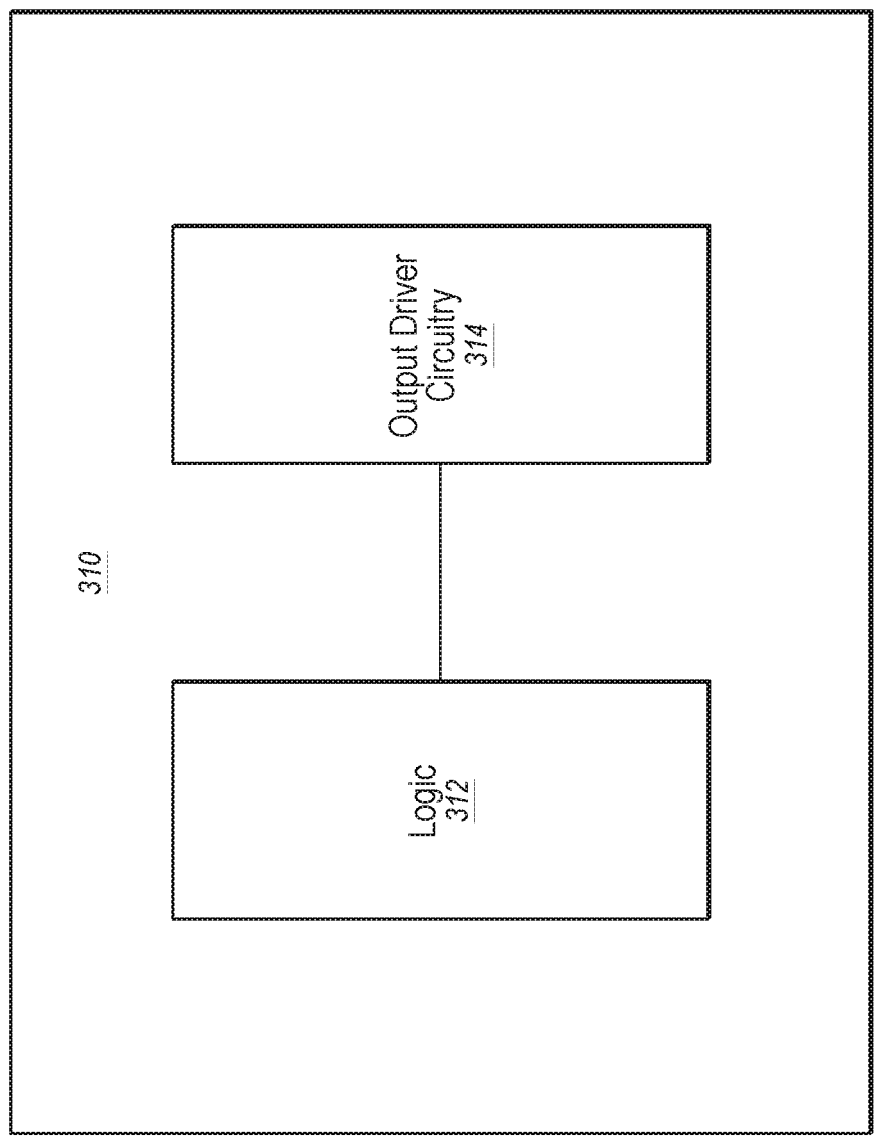
FIG. 3A is a block diagram of an output device including logic and output driver circuitry, according to one or more embodiments of the present disclosure.

FIG. 3A is a block diagram of an example output device 310, according to various embodiments of the present disclosure. Output device 310, which may include output device 216 of FIG. 2, may include logic 312 coupled to output driver circuit 314. In at least some embodiments, logic 312 may be configured to receive one or more signals indicative of an operational mode of an associated memory device (e.g., memory device 202; see FIG. 2). Alternatively or additionally, logic 312 may be configured to convey one or more signals to output driver circuit 314 for configuring one or more tuning devices (not shown in FIG. 3A) of output driver circuit 314. More specifically, for example, logic 312 may be configured to receive one or more input signals from, for example, control circuitry (e.g., control circuitry 211 of FIG. 2), calibration circuitry (e.g., calibration circuitry 215 of FIG. 2), a memory controller (e.g., controller 112 of FIG. 1), a mode register (e.g., mode register 213 of FIG. 2), and/or a memory array (e.g., memory array 214 of FIG. 2). Further, based on the one or more input signals, logic 312 may determine an operational mode of the associated memory device. Moreover, based on the determined operational mode, logic 312 may output one or more signals (e.g., control signals) to output circuit 314 to, for example, tune an ODI or an ODT impedance of the associated memory device.

Figure 3B:
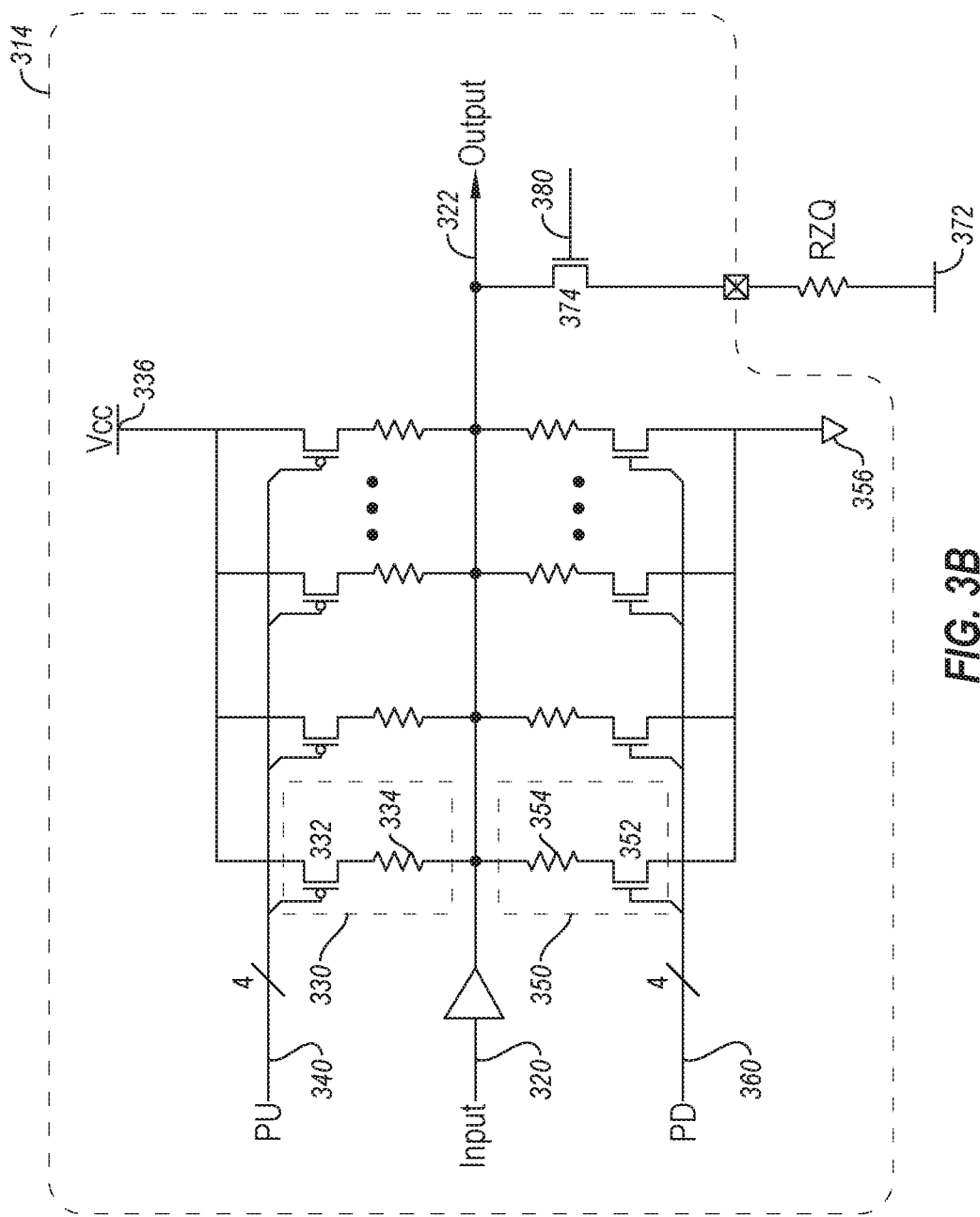
FIG. 3B is a schematic diagram of output driver circuitry of a memory device, in accordance with various embodiments of the present disclosure.

With reference again to FIG. 2, as noted above, in response to memory device 202 operating in an active mode, output driver circuit 218 may be configured in an active configuration (e.g., via one or more pull-up and/or pull-down tuning devices) to tune an ODI of memory device 202. Further, in response to memory device 202 operating in an inactive mode, output driver circuit 218 may be configured in an inactive configuration (e.g., via one or more pull-up and/or pull-down tuning devices) to tune an ODT impedance of memory device 202. FIG. 3B depicts example output driver circuit 314, according to various embodiments of the present disclosure. Output driver circuit 314 (also referred to herein as "driver circuitry") includes an input 320 (e.g., coupled to logic 312 of FIG. 3A) and an output node 322, which may be one of a number of output nodes (e.g., output node 225) coupled to a data bus (e.g., data bus 208 of FIG. 2).

Output driver circuit 314 also includes a number of pull-up tuning devices (also referred to herein as "tunable legs") 330 including a transistor 332 and a resistor 334 coupled between output node 322 and a supply node 336. Supply node 336 may be coupled to receive a positive voltage, such as a supply potential Vcc. Control gates of each transistor 332 of pull-up tuning devices 330 may be coupled by signal lines 340 to receive control signals generated by, for example, logic 312 (see FIG. 3A), control circuitry 211, and/or the calibration circuitry 215 (see FIG. 2). For example, signal lines 340 in the example of FIG. 3B may include four discrete signal lines, one signal line coupled to a control gate of each of the four transistors 332 (e.g., in a one-to-one relationship).

Driver circuit 314 also includes another number of pull-down tuning devices (also referred to herein as "tunable legs") 350 including a transistor 352 and a resistor 354 coupled between output node 322 and a reference node 356. Reference node 356 may be configured to receive a reference potential, such as a ground potential. Similar to the transistors 332 of pull-up tuning devices 330, control gates of each transistor 352 of pull-down tuning devices 350 may be coupled by signal lines 360 to receive control signals generated by, for example, logic 312 (see FIG. 3A), control circuitry 211, and/or the calibration circuitry 215 (see FIG. 2). Signal lines 360 in the example of FIG. 3B may include four discrete signal lines, one signal line coupled to a control gate of each of the four transistors 352 (e.g., in a one-to-one relationship). Each pull-up tuning device 330 and/or each pull-down tuning device 350 may be configured to exhibit a different tuning impedance when activated.

In response to receipt of one or more signals, output driver circuit 314 may selectively activate various combinations of one or more pull-up tuning devices 330 and/or one or more pull-down tuning devices 350 of output driver circuit 314, such as while an associated memory device (e.g., memory device 202 of FIG. 2) is in an inactive mode, while the associated memory device is an active mode, or while the associated memory device is performing a calibration operation. In some embodiments, ODI tuning of a memory device may be carried out using one or more dedicated tuning devices of the memory device, and ODT impedance tuning of the memory device may be carried out using one or more other dedicated tuning devices of the memory device. In other embodiments, ODI tuning and ODT tuning of a memory device may be carried out via any one or more tuning devices of the memory device.

FIG. 3B further illustrates reference resistance RZQ coupled between a reference node 372 and output node 322. In some embodiments, reference node 372 may be coupled to receive the same reference potential as reference node 356. Resistor RZQ may be coupled to output node 322 via a transistor 374. As described more fully below, during a calibration operation, calibration circuitry (e.g., calibration circuitry 215 of FIG. 2) may convey a control signal via a control signal line 380 to selectively activate transistor 374 to couple output node 322 to resistor RZQ. Further, the calibration circuitry may convey a control signal via control signal line 380 to selectively deactivate transistor 374 to decouple output node 322 from resistor RZQ.

Output driver circuit 314 is provided as an example output driver circuit and other output driver circuits (e.g., including one or more tuning devices) are within the scope of the present disclosure. For example, an output driver circuit may include more or less tuning devices than shown in FIG. 3B and/or an output driver circuit may have the same or different numbers of pull-up tuning devices and/or pull-tuning termination devices as shown in FIG. 3B.

According to various embodiments, an operation for calibrating a memory device (e.g., memory device 202 of FIG. 2), and more specifically, an output device (e.g., output device 216) of the memory device may be performed. More specifically, with reference to FIG. 3B, output driver circuit 314 may be calibrated to determine which one or more pull-up tuning devices 330 and/or pull-down tuning devices 350 may be selected (e.g., activated) to achieve a desired impedance (e.g., ODI and/or ODT impedance) of output driver circuit 314 (e.g., at output node 322).

In some embodiments, calibration operations may be facilitated by reference to one or more voltage reference potentials and/or resistor RZQ. Further, a calibration process may include an iterative process to determine which tuning configuration (e.g., including one or more tuning devices) to use (e.g., to generate optimized impedance values) in response to one or more factors, such as an operational mode of a memory device, and/or other system and/or device requirements.

In some embodiments, during calibration, for each memory device of a memory system, various tuning configurations (e.g., including one or more output driver circuits of a memory device) for generating one or more ODIs may be determined, and one or more values, codes, parameters, etc. that identify the determined ODI tuning configurations may be stored (e.g., in a register of the memory device and/or a memory controller). Moreover, for each memory device of the memory system, various tuning configurations (e.g., including one or more output driver circuits of the memory device) for generating one or more ODT impedances may be determined, and one or more values, codes, parameters, etc. that identify the determined ODT impedance tuning configurations may be stored (e.g., in a register of one or more memory devices and/or a memory controller). Further, during operation of the memory system, the stored values, codes, and/or parameters may be accessed and/or used to configure one or more output driver circuits of one or more memory devices in the various ODT and/or ODI tuning configurations, depending on operational modes of the memory devices.

Various processes for calibrating output drivers are known in the art, and thus some calibration details may not be discussed herein. For example only, a calibration process may be carried out via one or more calibration processes as disclosed in U.S. Pat. No. 9,324,410, assigned to the Assignee of the present disclosure and the disclosure of which is incorporated herein in its entirety by this reference. Nonetheless, in accordance with various embodiments of the disclosure, memory devices of a memory system may be calibrated such that ODT impedances and ODIs for the memory devices may be independently calibrated and/or tuned.

As noted above, in some embodiments, during and/or after a calibration process, tuning values (e.g., optimized values) for a memory device may be stored (e.g., within the memory device). Further, during operation of the memory device, one or more stored tuning values (also referred to herein as "trim values" or simply "trim") may be accessed and used for configuring the output circuitry of the memory device during operation. Moreover, in some embodiments, as described more fully below, one or more parameters may be used for referencing a tuning configuration and/or one or more tuning devices. For example, as described more fully below, a tuning configuration may be dependent on a parameter (e.g., a parameter $\beta$, parameter $\gamma$, etc.), which may refer to one or more tunable legs of an output device. Yet more specifically, for example, an impedance of 240 ohms+$\beta$ may refer to an impedance calibrated to resistor RZQ and one additional tunable leg of an output device. As another example, an impedance of 240 ohms+$\gamma$ may refer to an impedance calibrated to resistor RZQ and two additional tunable legs of an output device.

Figure 4A:
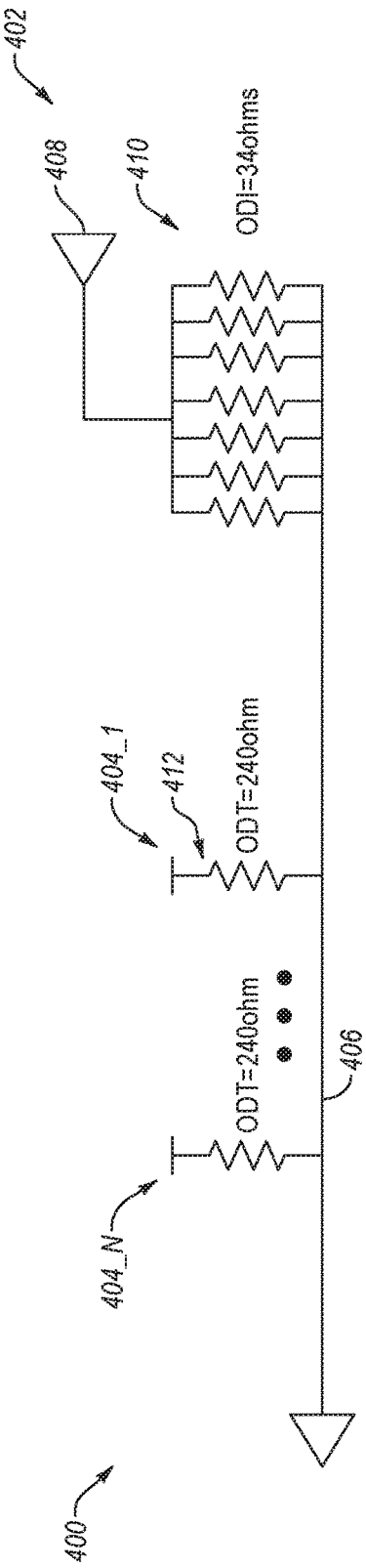
FIG. 4A depicts a portion of a conventional memory system in a default configuration.
Figure 4B:
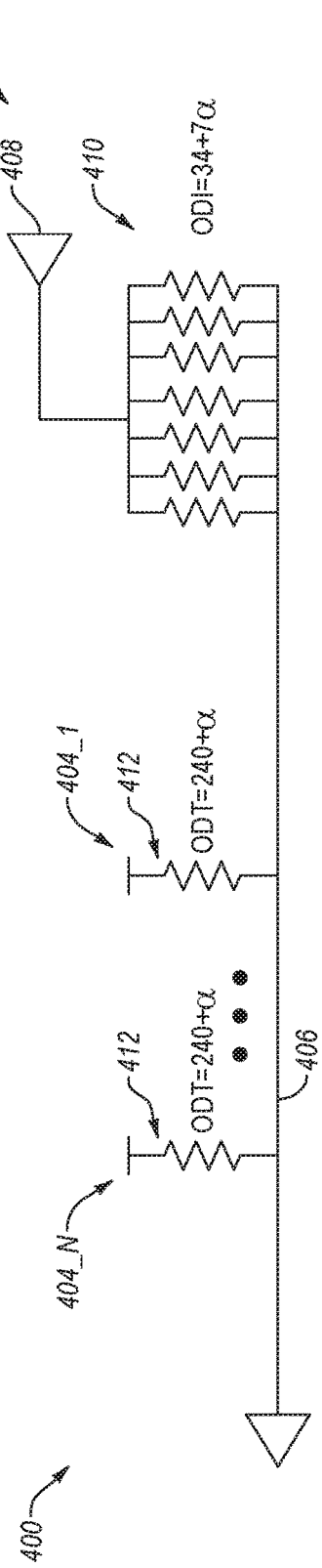
FIG. 4B depicts a portion of the conventional memory system of FIG. 4A in a read operation.
Figure 4C:
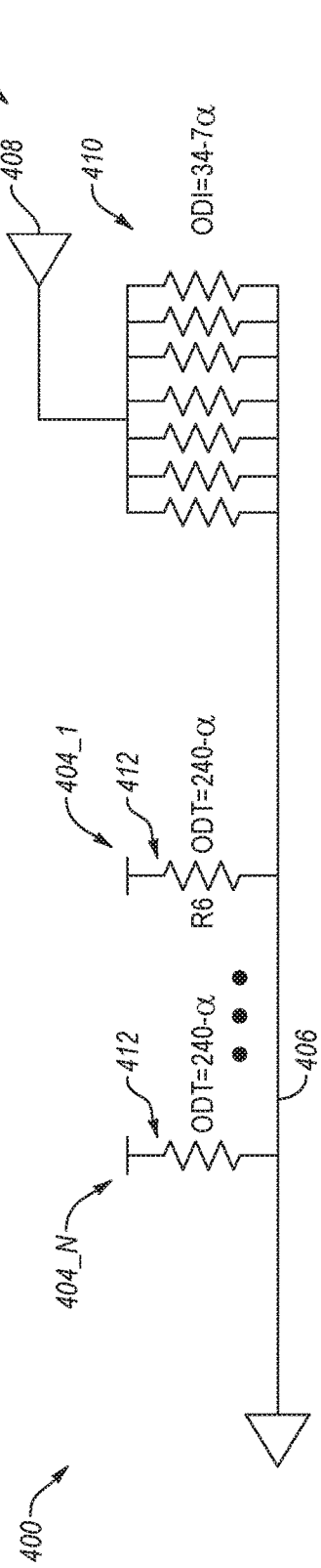
FIG. 4C depicts a portion of the conventional memory system of FIG. 4A in another read operation.

In prior art memory systems, ODI and ODT impedance values are tuned together (e.g., ODI and ODT impedance values depend on a common parameter) without distinguishing termination (e.g., for inactive memory devise) from data transmission (e.g., for an active memory devices). FIGS. 4A-4C each depict a portion of a conventional memory system 400 including an active memory device 402 and inactive memory devices 404. Each memory device (i.e., active memory device 402 and inactive memory devices 404_1-404_N) may be coupled to a controller (not shown in FIGS. 4A-4C) via a bus 406. Active memory device 402 includes a driver 408 coupled to bus 406 of memory system 400 via tuning device 410. Further, each inactive memory device 404 is coupled to bus 406 via a tuning device 412.

FIG. 4A depicts memory system 400 in a default configuration, wherein neither termination nor a drive strength is being tuned. In this configuration, tuning device 410 may include an impedance of, for example, approximately 34 ohms, and tuning device 412 may include an impedance of, for example, approximately 240 ohms.

FIGS. 4B and 4C depict memory system 400, wherein, during read operations, on-die termination (ODT) impedances of inactive memory devices 404_1-404_N and an output driver impedance (ODI) of active memory device 402 are tuned via a single parameter. More specifically, both tuning device 410 (i.e., of active memory device 402) and tuning device 412 (i.e., of each inactive memory device 404) are tuned with a parameter $\alpha$. Yet more specifically, in FIG. 4B, during a first read operation, tuning device 410 may be tuned to include an impedance of, for example, approximately 34+7$\alpha$ ohms, and each tuning device 412 may be tuned to include an impedance of, for example, approximately 240+$\alpha$ ohms. Further, in FIG. 4C, during a second read operation, tuning device 410 may be tuned to include an impedance of approximately 34−7$\alpha$ ohms, and tuning device 412 (i.e., of each inactive memory device 404) may be tuned to include an impedance of approximately 240−$\alpha$ ohms.

A time period in which data presented on an output (e.g., an output pad) of a memory system is valid (e.g., during a given clock cycle) is often referred to as the "data eye" or "data envelope." Those of ordinary skill in the art will appreciate that although signal transitions representing a succession of data bits presented on an output of a memory system may ideally occur instantaneously (e.g., with true, square rising and falling edges), in practical implementations, such signal transitions are more gradual. That is, a signal's transition from a logic high level to a logic low level may take some amount of time. Thus, for a given clock cycle, a time period during which the data is valid (i.e., during the data eye) for a given output bit is something less than the entire time duration of the clock cycle for single data rate transmissions or something less than a half clock cycle for double data rate transmissions.

Figure 5:
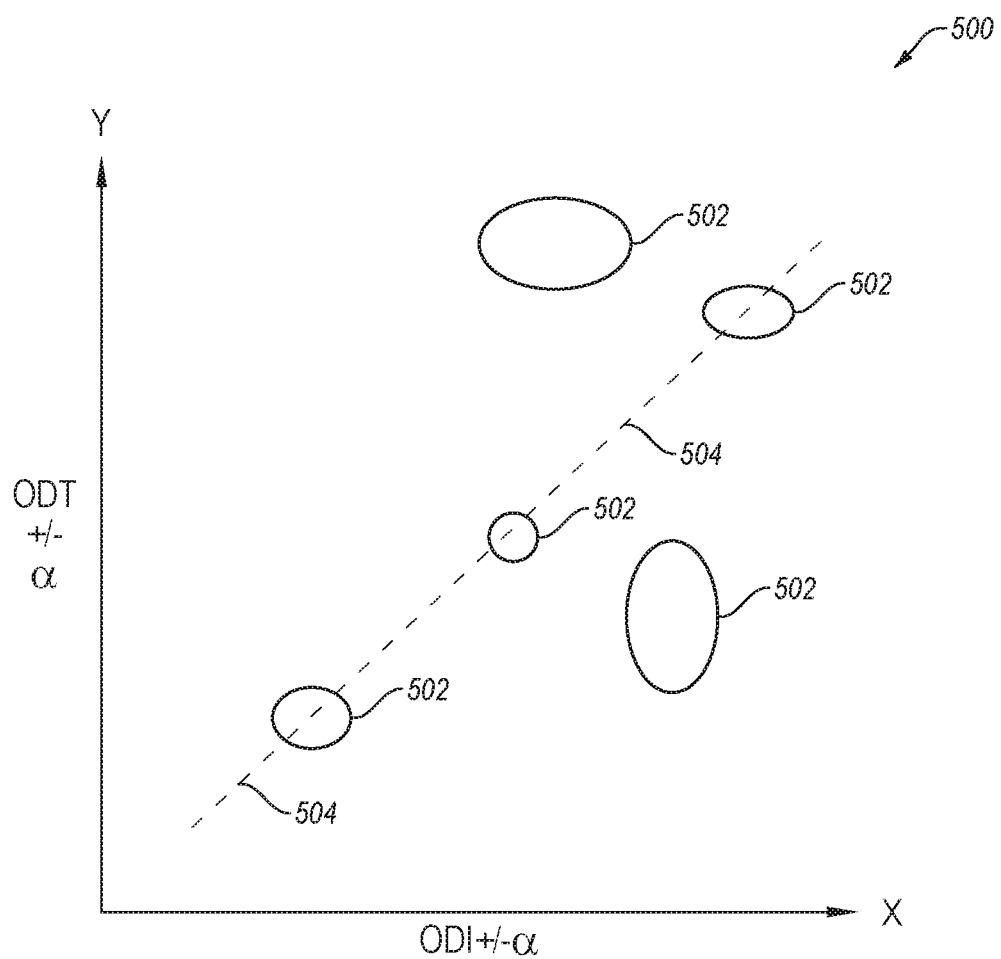
FIG. 5 is a plot depicting data eyes for a memory system.

FIG. 5 is a plot 500 depicting data eyes 502 for a memory system wherein an x-axis represents ODI values and a y-axis represents ODT impedance values. More specifically, as illustrated, the x-axis of plot 500 may represent an ODI value that may be based on a parameter α, and the y-axis of plot 500 may represent an ODT impedance value that may also be based on parameter α. In conventional memory systems, because ODT impedance values and ODI values are both tuned based on a single parameter (e.g., parameter α), valid data may only be captured during data eyes positioned along a line 504 (e.g., at a 45 degree angle relative to the x-axis). Data may not be captured during data eyes, include possibly larger data eyes, that are not positioned along line 504.

As disclosed herein, various embodiments relate to memory systems configured such that on-die termination (ODT) impedance (e.g., for termination) and output driver impedance (ODI) (e.g., for drive strength) may be separately and/or independently tuned. Yet more specifically, for example, ODT impedance values for one or more inactive memory devices of a memory system may be tuned via a first parameter, and an ODI value for an active memory device of the memory system may tuned via a second, different parameter.

Figure 6A:
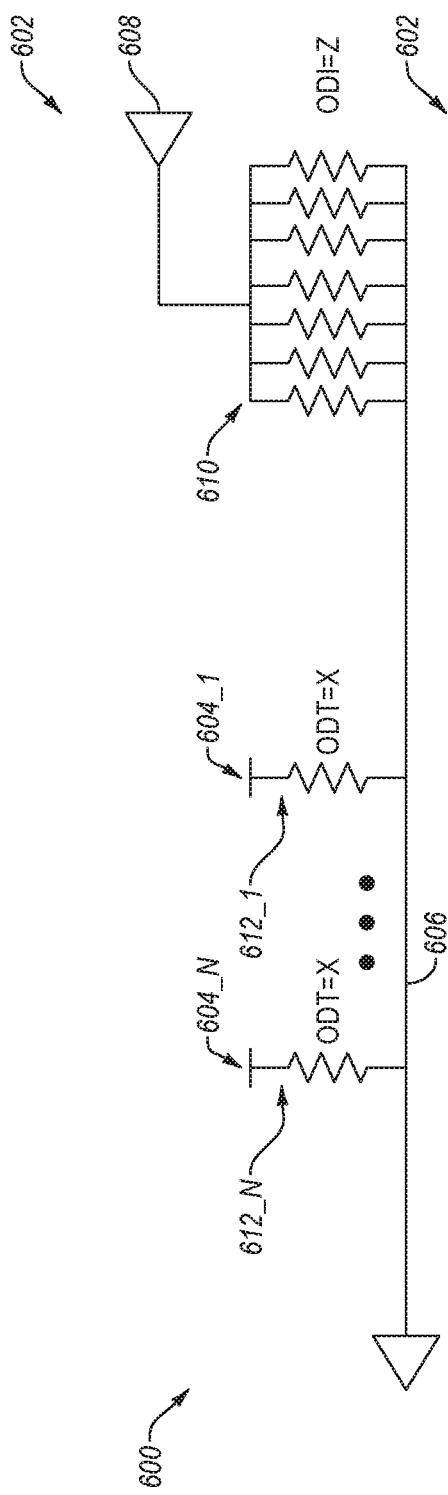
FIG. 6A depicts a portion of a memory system in a default configuration, according to various embodiments of the disclosure.
Figure 6B:
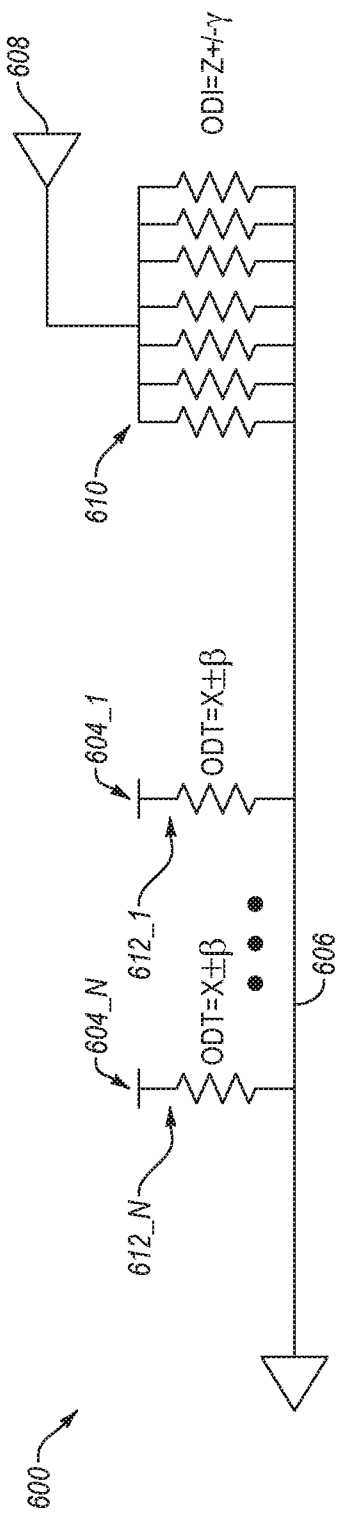
FIG. 6B depicts a portion of the memory system of FIG. 6A during a read operation, in accordance with various embodiments of the disclosure.

FIGS. 6A and 6B each depict a portion of a memory system 600, according to various embodiments of the present disclosure. Memory system 600 includes an active memory device 602 and inactive memory devices 604_1-604_N. For example, active memory device 602 may include memory device 102 (see FIG. 1) and/or memory device 202 (see FIG. 2), and inactive memory devices 604_1-604_N may include memory devices 103-105 (see FIG. 1).

Each memory device (i.e., active memory device 602 and inactive memory devices 604_1-604_N)) may be coupled to a controller (not shown in FIG. 6A or FIG. 6B) via a bus 606 which may include, for example, bus 110 of FIG. 1. Active memory device 602 includes a driver 608 coupled to bus 606 via tuning device 610, which may exhibit an impedance of Z. For example, tuning device 610 may include one or more of pull-up tuning devices 330 and/or one or more of pull-down tuning devices 350 (see FIG. 3B). Further, each inactive memory device 604 is coupled to bus 606 via a tuning device 612, which may exhibit an impedance of X. For example, tuning device 612 may include one or more pull-up tuning devices and/or one or more pull-down tuning devices, as described herein.

FIG. 6A depicts memory system 600 in a default configuration, wherein neither termination (ODT) nor a drive strength (ODI) is being tuned. Further, FIG. 6B depicts memory system 600 wherein, during, for example, a read operation, an ODT impedance value of inactive memory devices 604_1-604_N are tuned (e.g., via one or more tuning devices) with a first parameter β, and an ODI value of active memory device 602 is tuned (e.g., via one or more tuning devices) with a second, different parameter γ. Yet more specifically, in the example shown in FIG. 6B, tuning device 610 of active memory device 602 is tuned to include an ODI of, for example, approximately Z+/−γ ohms. Further, each tuning device 612 of inactive memory devices 604_1-604_N is tuned to include an ODT impedance of, for example, approximately X+/−β ohms.

Figure 7:
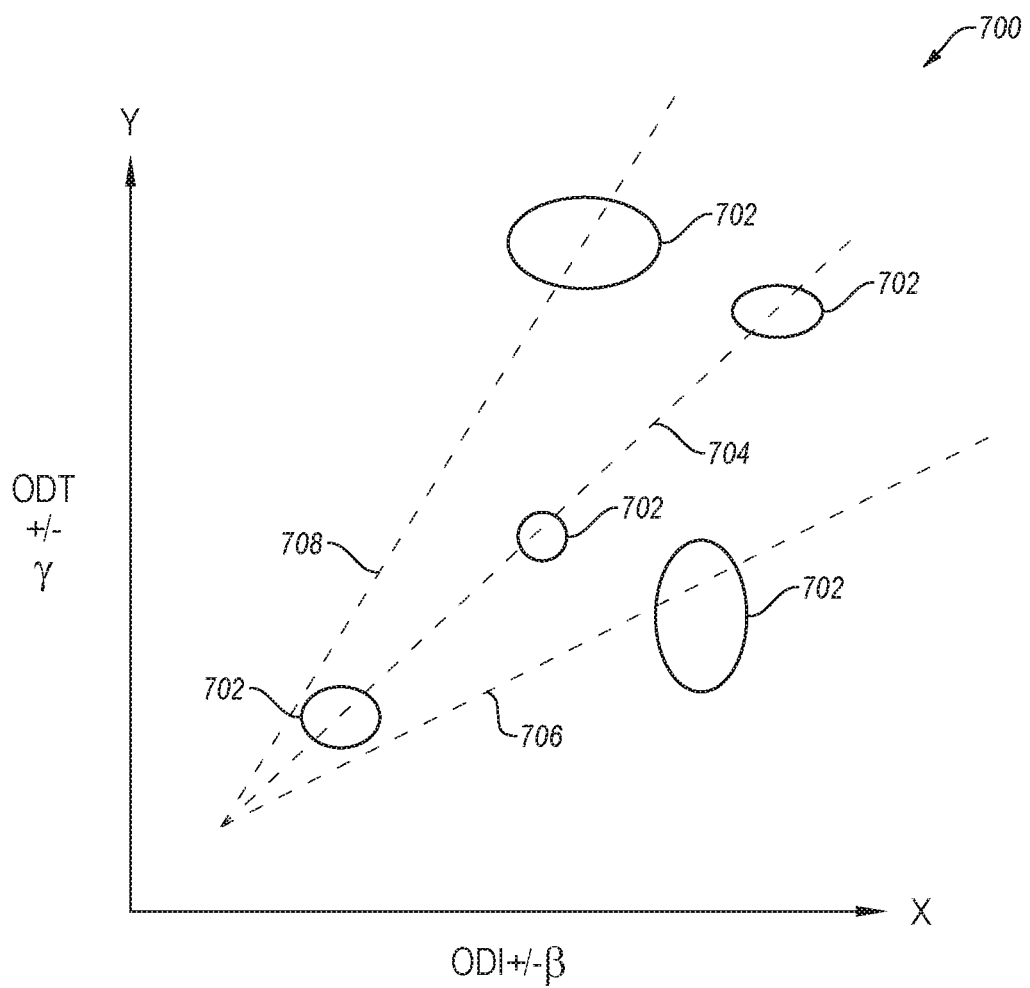
FIG. 7 is a plot depicting a data eyes for a memory system.

FIG. 7 is a plot 700 depicting data eyes 702 for a memory system wherein an x-axis of plot 700 represents ODI values and a y-axis of plot 700 represents ODT impedance values. More specifically, as illustrated, the x-axis may represent an ODI value that may be based on a parameter β, and the y-axis may represent an ODT impedance value that may be based on a parameter γ. In contrast to conventional memory systems, which may only utilize data eyes along a 45 degree line (i.e., line 704), data eyes that are not along line 704 may also be utilized via independent tuning of ODI and/or ODT impedance values. Accordingly, for example, data may be captured at data eyes along line 704, along a line 706 (e.g., at a 30 degree angle relative to the x-axis), along a line 708 (e.g., at a 60 degree angle relative to the x-axis), and/or at any other data eye on plot 700.

According to some embodiments of the present disclosure, during a write operation, each memory device of a memory system may be tuned based on a single parameter. FIGS. 8A and 8B depict a portion of a memory system 800, according to various embodiments of the present disclosure. Memory system 800 includes an active memory device 802 and inactive memory devices 804_1-804_N. For example, active memory device 802 may include active memory device 602 of FIGS. 6A and 6B, and inactive memory devices 804_1-804_N may include inactive memory devices 604_1-604_N of FIGS. 6A and 6B.

Each memory device (i.e., active memory device 802 and inactive memory devices 804_1-804_N) may be coupled to a controller (not shown in FIG. 8A or FIG. 8B) via a bus 806, which may include, for example, bus 110 of FIG. 1. Active memory device 802 includes a driver 808 coupled to bus 806 via tuning device 810, which may exhibit an impedance of Z. Further, each inactive memory device 804 is coupled to bus 806 via a tuning device 812, which may exhibit an impedance of X.

FIG. 8A depicts memory system 800 in a default configuration, wherein neither termination (ODT) nor a drive strength (ODI) is being tuned. Further, FIG. 8B depicts memory system 800 during a write operation. During a write operation, each memory device of memory system 800 may be configured in a termination mode (i.e., an inactive mode). Thus, as illustrated in FIG. 8B, ODT impedance values of each inactive memory device 804_1-804_N and active memory device 802 may be tuned (e.g., via one or more tuning devices) based on parameter β. Yet more specifically, in the example shown in FIG. 8B, tuning device 810 of active memory device 802 may be tuned to include an ODT impedance of, for example, approximately Z+/−β ohms. Further, each tuning device 812 (i.e., of inactive memory devices 804_1-804_N) may be tuned to include an ODT impedance of, for example, approximately X+/−β ohms.

Figure 9:
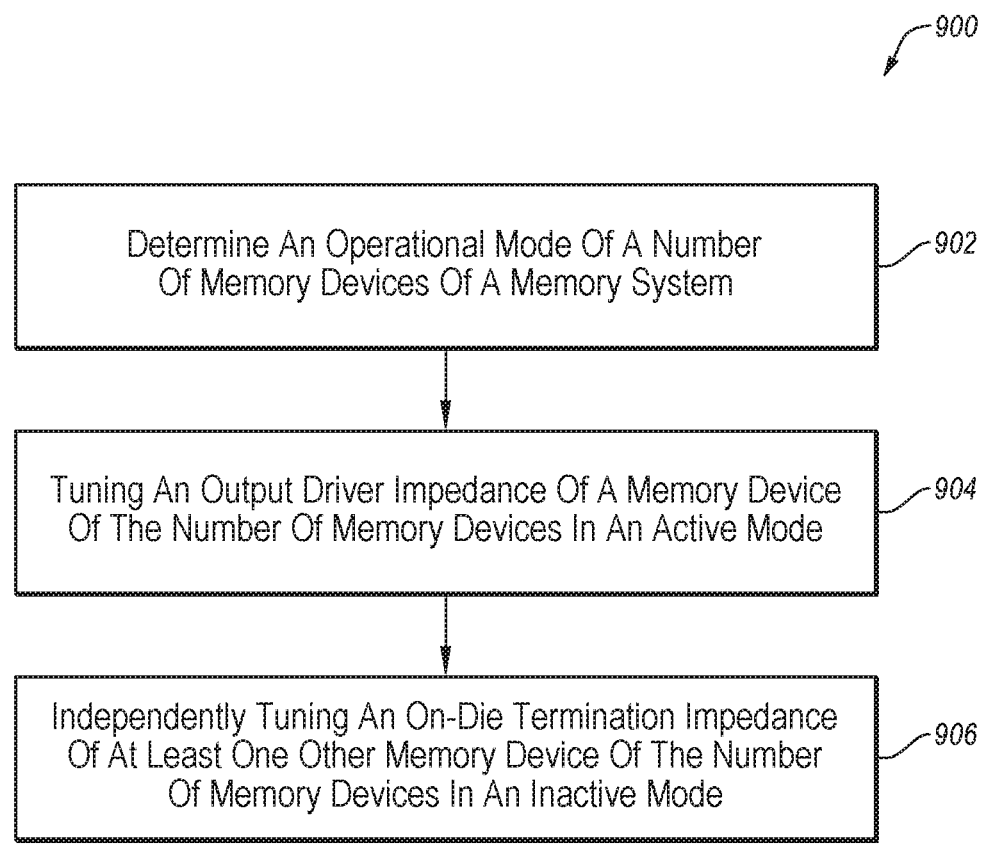
FIG. 9 is a flowchart illustrating an example method of tuning impedances of a memory system.

FIG. 9 is a flowchart of an example method 900 for independently tuning memory devices of a memory system. Method 900 may be arranged in accordance with at least one embodiment described in the present disclosure. Method 900 may be performed, in some embodiments, by a device or system, such as memory system 100 of FIG. 1, one or more memory devices of memory system 100, memory device 202 of FIG. 2, output device 310 of FIG. 3A, output driver circuitry 314 of FIG. 3B, memory system 600 of FIGS. 6A and 6B, memory system 800 of FIGS. 8A and 8B, device 1000 of FIG. 10, system 1100 of FIG. 11, or another device or system. Although illustrated as discrete blocks, various blocks may be divided into additional blocks, combined into fewer blocks, or eliminated, depending on the desired implementation.

Method 900 may begin at block 902, wherein an operational mode of a number of memory devices of a memory system may be determined, and method 900 may proceed to block 904. For example, it may be determined whether the memory system is in a read operation or a write operation. Further, for example, for each memory device (e.g., memory devices 102-105 of FIG. 1) of the memory system (e.g., memory system 100 of FIG. 1), it may be determined whether the memory device is in active (drive) mode, an inactive (termination) mode, or another mode. For example, based on data (e.g., one or more settings and/or data of mode register 213 of FIG. 2) and/or one or more signals (e.g., received from a controller (e.g., controller 112 of FIG. 1), control circuitry (e.g., control circuitry 211 of FIG. 2)), it may be determined whether the memory device is in an active mode, an inactive mode, or another mode (e.g., a default mode).

At block 904, an output driver impedance (ODI) of a memory device of the memory system determined to be in an active mode may be tuned, and method 900 may proceed to block 906. For example, in response to determining that a memory device (e.g., memory device 102) of memory system 100 (see FIG. 1) is in an active mode, one or more tuning devices (e.g., tuning devices 330 and/or 350 of FIG. 3B) of an output device (e.g., output device 310 of FIG. 3A) of the active memory device may be configured such that the output device exhibits a desired ODI. For example, the ODI of the output device of the active memory device may be set based on a first parameter. Further, for example, one or more stored "trim" values may be used to configure the one or more tuning devices.

At block 906, an on-die termination (ODT) impedance of at least one memory device of a memory system determined to be in an inactive mode may be tuned. For example, in response to determining that a memory device (e.g., memory device 103 of memory system 100; see FIG. 1) is in an inactive (termination) mode, one or more tuning devices (e.g., tuning devices 330 and/or 350 of FIG. 3B) of an output device (e.g., output device 310 of FIG. 3A) of the inactive memory device may be configured such that the output device exhibits a desired ODT impedance. For example, the ODT impedance of the output device of the inactive memory device may be tuned based on a second parameter, which may be different than the parameter used to tune the ODI of the output device of the active memory device. Further, for example, one or more stored "trim" values may be used to configure the one or more tuning devices.

Modifications, additions, or omissions may be made to method 900 without departing from the scope of the present disclosure. For example, the operations of method 900 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, in various embodiments, an output device of each memory device of the memory system may be calibrated. More specifically, with reference to FIG. 2, for example, output device 216 of memory device 202 may be calibrated via calibration circuitry 215. Further, trim values (e.g., determined via a calibration process) may be stored (e.g., in an associated memory device).

A semiconductor device is also disclosed. The semiconductor device, which may include a memory device, may include one or more arrays (e.g., memory arrays). The semiconductor device may also include an output device including one or more output driver circuits, as described herein.

FIG. 10 is a simplified block diagram of a semiconductor device 1000 implemented according to one or more embodiments described herein. Semiconductor device 1000 includes a memory array 1002 and a control logic component 1004. For example, memory array 1002 may include memory array 214 of FIG. 2, and control logic component 1004 may include control circuitry 211 of FIG. 2. Memory array 1002 may include one or more memory cells. Control logic component 1004 may be operatively coupled with the memory array 1002 so as to read, write, or re-fresh any or all memory cells within the memory array 1002. Semiconductor device 1000 further includes an output device 1006, which may include one or more output driver circuits including one or more tuning devices, as described herein.

An electronic system is also disclosed. The electronic system may include memory system including a number of memory devices. FIG. 11 is a simplified block diagram of an electronic system 1100 implemented according to one or more embodiments described herein. Electronic system 1100 includes at least one input device 1102. Input device 1102 may be a keyboard, a mouse, or a touch screen. Electronic system 1100 further includes at least one output device 1104. Output device 1104 may be a monitor, touch screen, or speaker. Input device 1102 and output device 1104 are not necessarily separable from one another. Electronic system 1100 further includes a storage device 1106. Input device 1102, output device 1104, and storage device 1106 are coupled to a processor 1108.

Electronic system 1100 further includes a memory system 1110 coupled to processor 1108. Memory system 1110, which may include memory system 100 of FIG. 1, includes a number of memory devices (e.g., memory device 102-105 of FIG. 1). Electronic system 1100 may be include a computing, processing, industrial, or consumer product. For example, without limitation, electronic system 1100 may include a personal computer or computer hardware component, a server or other networking hardware component, a handheld device, a tablet computer, an electronic notebook, a camera, a phone, a music player, a wireless device, a display, a chip set, a game, a vehicle, or other known systems.

According to various embodiments disclosed herein, and in contrast to some conventional methods, systems, and devices, ODT impedances and ODIs of a number of memory devices of a memory system may be independently tuned, thus allowing for independent data eye tuning. Accordingly, Rank Margining Tool results for data eyes and associated semiconductor devices may be improved. Further, various embodiments may reduce or eliminate a need for expensive and time-consuming reticle changes (e.g., changes to transistor properties and/or circuit re-design for corrective actions) to semiconductor materials (e.g., silicon). Additionally, various embodiments may enhance flexibility for customizing integrated circuits.

One or more embodiments of the present disclosure include an apparatus. The apparatus may include a control device configured to determine an operational mode of the apparatus. The apparatus may also include at least one output circuit coupled to the control device. The at least one output circuit may be configured to generate a desired output driver impedance (ODI) during an active operational mode. The least one output circuit may further be configured to independently generate a desired on-die termination (ODT) impedance during an inactive operational mode.

Some embodiments of the present disclosure include a memory system including a number of memory devices. Each memory device of the number of memory devices may be configured to determine whether the memory device is in an active mode or an inactive mode. Each memory device may also be configured to tune an impedance of an output driver circuit of the memory device based on a first parameter in response to the memory device being in an active mode during a first read operation. Further, each memory device may be configured to tune the impedance of the output driver circuit based on a second, different parameter in response to the memory device being in an inactive mode during a second, different read operation.

Additional embodiments of the present disclosure include an electronic system. The electronic system may include at least one input device, at least one output device, at least one processor device operably coupled to the input device and the output device; and at least one memory system operably coupled to the at least one processor device. The memory system may include a controller and a first memory device coupled to the controller. The first memory device may be configured to generate an output driver impedance (ODI) based on a first parameter in response to the first memory device is operating in a drive mode. The memory system may also include at least one second memory device coupled to the controller. The at least one second memory device may be configured to generate an on-die termination (ODT) impedance based on a second, different parameter in response to the at least one second memory device operating in a termination mode.

Other embodiments include methods for operating a memory system. One such method may include determining an operational mode of each memory device of a number of memory devices of a memory system. The method may further include tuning an output driver impedance (ODI) of a memory device of the number of memory device operating in an active mode. Further, the method may include independently tuning an on-die termination (ODT) of at least one other memory device of the number of memory devices operating an inactive mode.

In accordance with common practice, the various features illustrated in the drawings may not be drawn to scale. The illustrations presented in the present disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. An apparatus, comprising:
a control device configured to determine an operational mode of the apparatus; and
at least one output circuit coupled to the control device and configured to:
generate a desired output driver impedance (ODI) during an active operational mode; and
independently generate a desired on-die termination (ODT) impedance during an inactive operational mode.

2. The apparatus of claim 1, wherein the at least one output circuit is further configured to generate another desired ODT impedance during a write operation.

3. The apparatus of claim 2, wherein the control device is configured to determine the operational mode of the apparatus based on at least one of a signal received from an external controller and one or more settings of the apparatus.

4. The apparatus of claim 1, wherein the at least one output circuit is configured generate the desired ODI based on a first parameter and generate the desired ODT impedance based on a second, different parameter.

5. The apparatus of claim 1, wherein the control device is configured to convey at least one control signal to the at least one output circuit to generate one of the desired ODI and the desired ODT impedance.

6. The apparatus of claim 1, further comprising a calibration circuit for calibrating the at least one output circuit to generate one of the desired ODI and the desired ODT impedance.

7. The apparatus of claim 1, wherein the at least one output circuit is configured to generate the ODI and the ODT impedance via at least one of one or more pull-up tuning devices and one or more pull-down tuning devices.

8. A memory system, comprising
a number of memory devices, each memory device configured to:
determine whether the memory device is in an active mode or an inactive mode;
tune an impedance of an output driver circuit of the memory device based on a first parameter in response to the memory device being in an active mode during a first read operation; and
tune the impedance of the output driver circuit based on a second, different parameter in response to the memory device being in an inactive mode during a second, different read operation.

9. The memory system of claim 8, wherein each memory device is configured to tune an output driver impedance (ODI) of the output driver circuit based on the first parameter in response to the memory device being in the active mode.

10. The memory system of claim 8, wherein each memory device is configured to tune an on-die termination (ODT) impedance of the output driver circuit based on the second, different parameter in response to the memory device being in the inactive mode.

11. The memory system of claim 8, wherein each memory device is configured to tune the impedance of the output driver circuit based on one of the first parameter and the second, different parameter during a write operation.

12. The memory system of claim 8, wherein the output driver circuit of each memory device includes one or more tuning devices for tuning the impedance of the output driver circuit.

13. The memory system of claim 8, wherein each memory devices comprise a calibration circuit coupled to the output driver circuit and configured to determine at least one desired output driver impedance (ODI) and at least one on-die termination (ODT) impedance for the output driver circuit.

14. The memory system of claim 8, wherein each memory device is configured to determine whether the memory device is in the active mode or the inactive mode based on a signal received from a controller coupled to each memory device of the number of memory devices.

15. The memory system of claim 8, wherein each memory device is configured to determine whether the memory device is in the active mode or the inactive mode based on at least one setting of a mode register of the memory device.

16. The memory system of claim 8, wherein each memory device is configured to tune the impedance of the output driver circuit via one or more tuning devices.

17. An electronic system, comprising:
at least one input device;
at least one output device;
at least one processor device operably coupled to the input device and the output device; and
at least one memory system operably coupled to the at least one processor device, the memory system comprising:
a controller; and
a first memory device coupled to the controller and configured to generate an output driver impedance (ODI) based on a first parameter in response to the first memory device is operating in a drive mode; and
at least one second memory device coupled to the controller and configured to generate an on-die termination (ODT) impedance based on a second, different parameter in response to the at least one second memory device operating in a termination mode.

18. A method of operating a memory system, comprising:
determining an operational mode of each memory device of a number of memory devices of the memory system;
tuning an output driver impedance (ODI) of a memory device of the number of memory devices operating in an active mode; and
independently tuning an on-die termination (ODT) of at least one other memory device of the number of memory devices operating an inactive mode.

19. The method of claim 18, wherein tuning the ODI of the memory device operating in the active mode comprises tuning the ODI of the memory device operating in the active mode based on a first parameter, and wherein independently tuning the ODT of the at least one other memory device operating in the inactive mode comprises tuning the ODT of the at least one other memory device operating in the inactive mode based on a second, different parameter.

20. The method of claim 18, wherein determining the operational mode of each memory device comprises determining, at each memory device, the operational mode of the memory device based on a signal received from a controller.

* * * * *